(12) United States Patent
Chu

(10) Patent No.: US 10,236,043 B2
(45) Date of Patent: Mar. 19, 2019

(54) EMULATED MULTIPORT MEMORY ELEMENT CIRCUITRY WITH EXCLUSIVE-OR BASED CONTROL CIRCUITRY

(71) Applicant: Altera Corporation, San Jose, CA (US)

(72) Inventor: Pohrong Rita Chu, Saratoga, CA (US)

(73) Assignee: Altera Corporation, San Jose, CA (US)

( * ) Notice: Subject to any disclaimer, the term of this patent is extended or adjusted under 35 U.S.C. 154(b) by 60 days.

(21) Appl. No.: 15/174,460

(22) Filed: Jun. 6, 2016

(65) Prior Publication Data
US 2017/0352393 A1   Dec. 7, 2017

(51) Int. Cl.
| | |
|---|---|
| *G11C 8/00* | (2006.01) |
| *G11C 8/12* | (2006.01) |
| *G06F 5/00* | (2006.01) |
| *G06F 9/30* | (2018.01) |
| *G11C 8/16* | (2006.01) |
| *G11C 7/10* | (2006.01) |

(52) U.S. Cl.
CPC .............. *G11C 8/12* (2013.01); *G06F 5/00* (2013.01); *G06F 9/30141* (2013.01); *G11C 7/1075* (2013.01); *G11C 8/00* (2013.01); *G11C 8/16* (2013.01)

(58) Field of Classification Search
CPC .... G11C 8/12; G11C 8/16; G11C 8/00; G06F 5/00; G06F 9/30141
USPC ...... 365/230.03, 230.02, 189.02, 63, 230.05, 365/230.04; 711/154, 127
See application file for complete search history.

(56) References Cited

U.S. PATENT DOCUMENTS

| | | |
|---|---|---|
| 5,197,062 A | 3/1993 | Picklesimer |
| 5,796,269 A | 8/1998 | New |
| 5,822,606 A | 10/1998 | Morton |
| 6,161,165 A | 12/2000 | Solomon et al. |
| 6,909,663 B1 | 6/2005 | Vemenker et al. |
| 7,417,482 B2 | 8/2008 | Elgebaly et al. |
| 7,508,697 B1 | 3/2009 | Mukhopadhyay et al. |

(Continued)

OTHER PUBLICATIONS

LaForest et al. ("Multi-Ported Memories for FPGAs via XOR," http://www.eecg.toronto.edu/~steffan/papers/laforest_xor_fpga12.pdf).*

(Continued)

*Primary Examiner* — Gene Auduong

(57) ABSTRACT

Integrated circuits may include memory element circuitry. The memory element circuitry may include multiple dual-port memory elements that are controlled to effectively form a multi-port memory element having multiple read and write ports. A respective bank of dual-port memory elements may be coupled to each write port. Write data may be received concurrently over one or more of the write ports and stored on the banks. Switching circuitry may be coupled between the banks and the read ports of the memory element circuitry. The switching circuitry may be controlled using read control signals generated by logic XOR-based control circuitry. The control circuitry may include dual-port memory elements that store addressing signals associated with the write data. The read control signals may control the switching circuitry to selectively route the most-recently written data to corresponding read ports during a data read operation.

20 Claims, 6 Drawing Sheets

(56) References Cited

U.S. PATENT DOCUMENTS

2006/0092740 A1     5/2006   Nii
2012/0324175 A1*   12/2012   Damodaran .............. G06F 5/00
                                                            711/154
2016/0127123 A1*   5/2016    Johnson .................. H04L 9/003
                                                            713/189

OTHER PUBLICATIONS

CircuitsToday ("Logic Gates," last updated Feb. 26, 2012, http://www.circuitstoday.com/logic-gates#XOR).*

Laforest et al., "Multi-Ported Memories for FPGAs via XOR", Department of Electrical and Computer Engineering, University of Toronto, Canada, FPGA'12, Feb. 22-24, 2012, Monterey, California <http://people.csail.mit.edu/ml/pubs/fpga12_xor.pdf>.

* cited by examiner

US 10,236,043 B2

EMULATED MULTIPORT MEMORY ELEMENT CIRCUITRY WITH EXCLUSIVE-OR BASED CONTROL CIRCUITRY

BACKGROUND

Integrated circuits often contain memory elements. Memory elements may be used to store data. Memory elements are often arranged in arrays. In a typical array, data lines are used to write data into the memory elements and are used to read data from the memory elements that have been loaded with data.

The memory elements may be configured in a dual-port arrangement. A conventional dual-port memory element stores data received over a write port. Data is read from the dual-port memory element over a read port. Such dual-port memory elements only support a single write or read operation at a given time. This limits the overall bandwidth and speed with which the integrated circuit performs memory accesses operations.

Certain operations of the integrated circuit require relatively high memory access bandwidth and speed capabilities that cannot be easily achieved using dual-port memory elements. For example, integrated circuits often perform complex or high speed operations that require multiple memory read and write requests to be performed for a given data packet at a time.

SUMMARY

Integrated circuits may include memory element circuitry. The memory element circuitry may include multiple dual-port memory elements (e.g., block Random Access Memory circuits having a single read port and a single write port) that are arranged and controlled to emulate or effectively form a multi-port memory element having multiple read and write ports.

The memory element circuitry may have multiple write ports and multiple read ports. A respective bank of dual-port memory elements may be coupled to each one of the write ports. Write data may be received concurrently over one or more of the write ports. Copies of the write data may be stored at each dual-port memory element in the corresponding bank. Switching circuitry may be coupled between the banks and the read ports of the memory element circuitry. The switching circuitry may be controlled using read control signals generated by logic exclusive-OR (XOR) based control circuitry. The read control signals may control the switching circuitry to selectively route read data (e.g., previously-stored write data) from the plurality of banks of dual-port memory elements to the corresponding read ports. For example, the switching circuitry may selectively route a most recently-written portion of the write data from the banks to a given one of the read ports based on the read control signals.

The logic XOR-based control circuitry may include a first set of logic XOR gates that receive addressing control signals associated with the write data provided to the banks of memory elements. The control circuitry may include a group of dual-port memory elements having write ports coupled to the outputs of the first set of logic XOR gates and may include a second set of logic XOR gates coupled to the read ports of the group of dual-port memory elements. The first set of logic XOR gates may generate modified addressing control signals based on the received addressing control signals and may output the modified addressing control signals to the group of dual-port memory elements for storage. The second set of logic XOR gates may generate the read control signals based the modified addressing control signals stored on the group of dual-port memory elements.

DETAILED DESCRIPTION

Embodiments of the present invention relate to integrated circuit memory elements with multiple ports. The memory elements, which are sometimes referred to as cells, may contain any suitable number of transistors.

The memory elements can be used in any suitable integrated circuits that use memory. These integrated circuits may be memory chips, digital signal processing circuits with memory arrays, microprocessors, application specific integrated circuits with memory arrays, programmable integrated circuits such as programmable logic device integrated circuits in which memory elements are used for configuration memory, or any other suitable integrated circuit. Programmable integrated circuits on which the memory elements are used may include, for example, programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

On integrated circuits such as memory chips or other circuits in which memory is needed to store processing data, the memory elements can be used to perform the functions of static random-access memory (RAM) cells and are sometimes referred to as SRAM cells. In the context of programmable logic device integrated circuits, the memory elements can be used to store configuration data and are therefore sometimes referred to in this context as configuration random-access memory (CRAM) cells.

Figure 1:
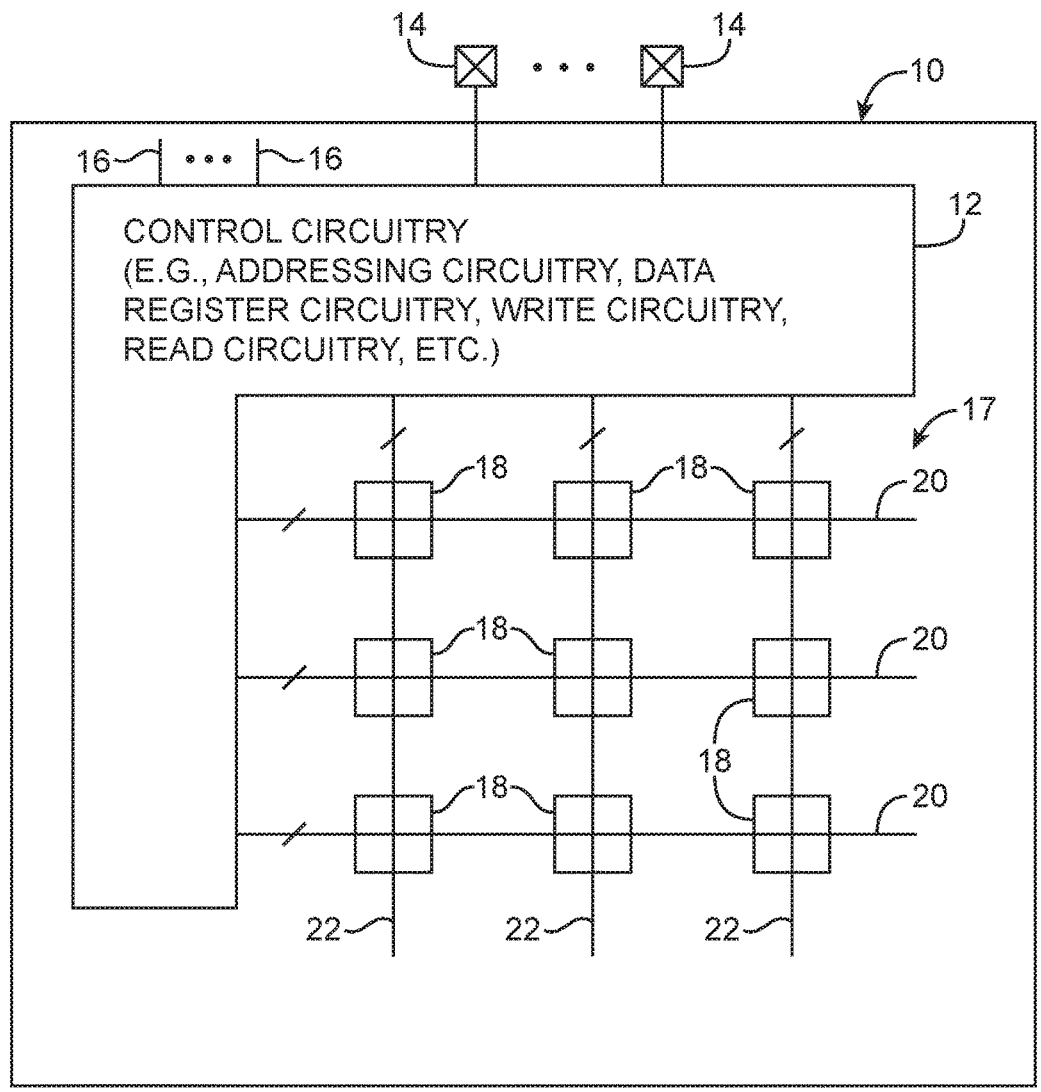
FIG. 1 is a diagram of an illustrative integrated circuit having memory element circuitry in accordance with an embodiment.

FIG. 1 shows an integrated circuit that may include an array of memory elements (cells or blocks) 18. Any suitable memory array architecture may be used for memory cells 18.

One suitable arrangement is shown in FIG. 1. There are only three rows and columns of memory cells 18 in the illustrative array of FIG. 1, but in general there may be hundreds or thousands of rows and columns in memory array 17. Array 17 may be one of a number of arrays on a given device 10, may be a subarray that is part of a larger array, or may be any other suitable group of memory cells 18. In one suitable arrangement that is sometimes described herein by example, memory elements 18 are each block random access memory elements (sometimes referred to as BRAM or block RAM elements or circuits).

Integrated circuit 10 may have control circuitry 12 for supplying signals to memory array 17. Control circuitry 12 may receive power supply voltages, data, and other signals from external sources using pins 14 and from internal sources using paths such as paths 16. Control circuitry 12 may include circuitry such as addressing circuitry, data register circuitry, write circuitry, read circuitry, logic or memory circuitry for controlling memory elements 18, etc. Control circuitry 12 may use the power supply voltages supplied by pins 14 to produce desired time-varying and fixed signals on paths such as paths 20 and 22.

There may, in general, be any suitable number of conductive lines associated with paths 20 and 22. For example, each row of array 17 may have associated address lines (e.g., true and complementary address lines) in a respective one of paths 20 (as an example). Each column of array 17 may have associated data lines (e.g., true and complementary data lines) in a respective one of paths 22. Address lines 20 may sometimes be referred to as word lines, whereas data lines 22 may sometimes be referred to as bit lines, for example. Control circuitry 12 may provide write data to be written onto memory elements 18 over paths 22 and may provide corresponding write addressing signals to memory elements 18 over paths 20 (e.g., the addressing signals may identify memory addresses on which to write corresponding data). Similarly, control circuitry 12 may provide read addressing signals to memory elements 18 over paths 20 to read corresponding data from elements 18 over paths 22.

The example of FIG. 1 is merely illustrative. In general, any desired number of addressing and data lines may be coupled to any desired sets of elements 18 in any desired manner. The terms "rows" and "columns" merely represent one way of referring to particular groups of cells 18 in memory array 17 and may sometimes be used interchangeably. If desired, other patterns of lines may be used in paths 20 and 22. For example, different numbers of power supply signals, data signals, and address signals may be used.

Memory elements 18 in integrated circuit 10 may be dual-port memory elements having only two data ports at which data can be written to or read from the memory element. For example, a given dual-port memory element may include a single read port at which data is read from the memory element and a single write port at which data is written to the memory element. In other examples, a given dual-port memory element may include two read ports and no write ports or two write ports and no read ports. Some integrated circuits 10 may include only dual-port memory elements 18 whereas other integrated circuits may include a mix of dual-port memory elements 18 and other memory elements having any desired number of ports.

Figure 2:
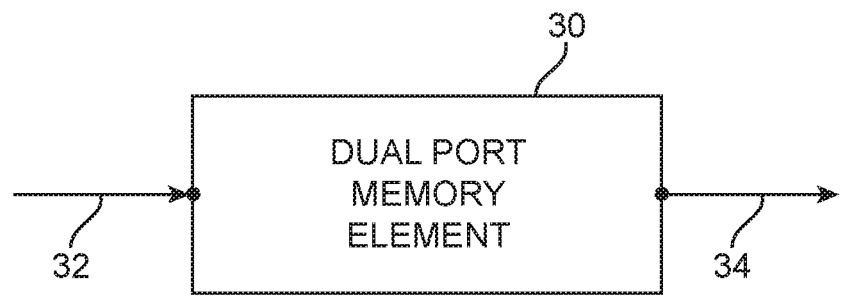
FIG. 2 is a diagram of an illustrative dual-port memory element in accordance with an embodiment.

As shown in FIG. 2, a given dual-port memory element 30 (e.g., a given memory element 18 in array 17 that has two data ports) may receive data at a write port such as write port 32. Memory element 30 may store the data received over write port 32. For example, memory element 30 may store the received data to a desired location (address) on memory element 30 as identified by a corresponding write addressing signal received by the memory element (not shown). Dual-port memory element 30 may be, for example, a dual-port RAM or block RAM element. When it is desired to read the stored data from memory element 30, the stored data may be read from read port 34. For example, data may be read from a desired location (address) on dual-port memory element 30 as identified by a corresponding read addressing signal received by the memory element (not shown).

Dual-port RAM elements such as element 30 only support a single write or read operation at a given time. This may limit the overall bandwidth and speed with which integrated circuit 10 accesses the memory elements. Certain operations of integrated circuit 10 may require increased memory access bandwidth/speed that cannot be easily achieved using only dual-port RAM elements. For example, integrated circuit 10 may perform complex or high speed operations that require multiple read and write requests to be performed for a given data packet at a time. Such operations may not be feasible when RAM elements having only a single read and write port are used. While RAM elements having multiple read and multiple write ports can be formed on integrated circuit 10, such memory elements often consume excessive resources on the integrated circuit.

Figure 3:
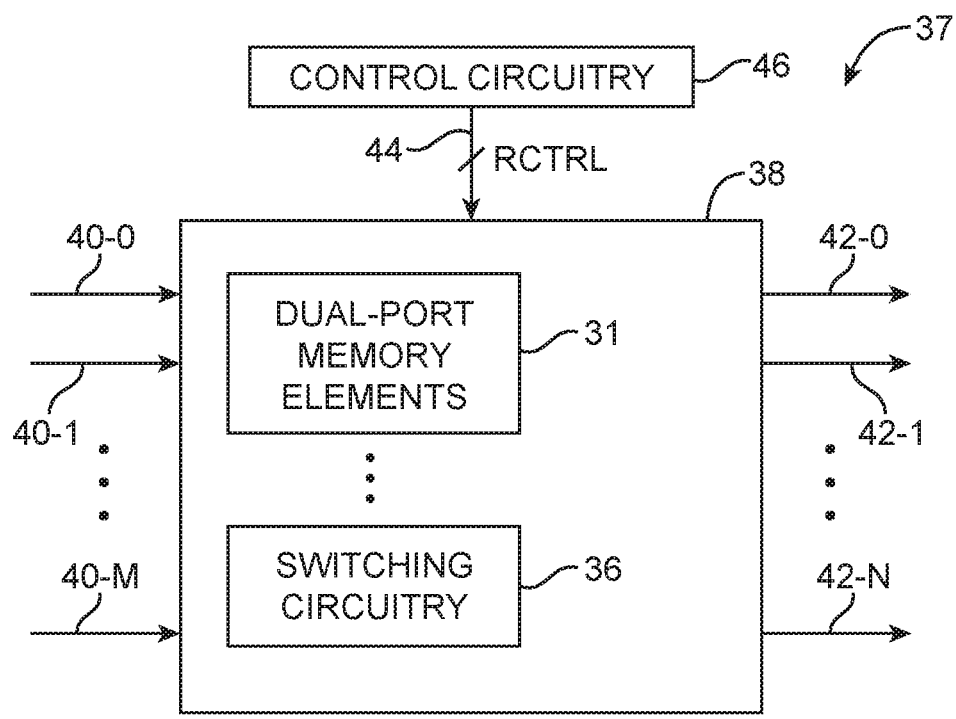
FIG. 3 is a diagram of an illustrative multiport memory element that is formed using multiple dual-port memory elements in accordance with an embodiment.

If desired, two or more dual-port RAM elements 30 may be arranged and controlled to serve as (e.g., emulate or effectively form) a multiport memory having more than two data ports. For example, multiple dual-port memory elements 30 may be arranged and controlled to effectively receive write data over two or more write ports and to read data over two or more read ports. FIG. 3 is a diagram showing how a multiport memory element may include multiple dual-port RAM elements.

As shown in FIG. 3, multiport memory circuitry 37 may include a number of dual-port memory elements 31 (e.g., dual-port memory elements such as elements 30 having a single read port and a single write port as shown in FIG. 2). Multiport memory circuitry 37 may sometimes be referred to herein as a multiport memory element, multiport memory circuit, emulated multiport memory circuit, emulated multiport memory element, multiport memory cell, emulated multiport memory cell, multiport memory, emulated multiport RAM, or emulated multiport memory. Circuitry 37 may include switching circuitry 36 that is coupled to dual-port memory elements 31. Multiport memory circuitry 37 may have a number M+1 of write ports 40 (e.g., a first write port 40-0, a second write port 40-1, a third write port 40-2, etc.) over which data is written to circuitry 37 (e.g., data from circuitry 12 of FIG. 1 may be written to one or more write ports 40 of multiport memory 37 over paths 22 as shown in FIG. 1). If desired, circuitry 37 may have zero write ports, one write port, two write ports, three write ports, four write ports, more than four write ports, or any other desired number of write ports.

Multiport memory circuitry 37 may have a number N+1 of read ports 42 (e.g., a first read port 42-0, a second read port 42-1, a third read port 42-2, etc.) over which data is read from circuitry 37 (e.g., data may be read from circuitry 37 over one or more read ports 42 and provided to circuitry 12 over paths 22). If desired, circuitry 37 may have zero read ports, one read port, two read ports, three read ports, four read ports, more than four read ports, or any other desired number of read ports. The number of read ports N+1 may be equal to the number of write ports M+1 or may be different than the number of write ports M+1.

Multiport memory element 37 may include control circuitry such as control circuitry 46. Switching circuitry 36 and dual-port memory elements 31 may sometimes be referred to collectively herein as data portion 38, data storage portion 38, or data storage circuitry 38 of multiport memory element 37. Control circuitry 46 may generate control signals RCTRL and may provide control signals RCTRL to data portion 37 over paths 44 for controlling the operation of data portion 38. For example, control signals RCTRL may control switching circuitry 36 to selectively couple the read port of a given memory element 31 to a corresponding read port 42 of multiport circuitry 37.

Multiple dual-port memory elements 31 in multiport memory 37 may be grouped together into banks. The dual-port memory elements 31 in each bank may each be coupled to a single corresponding write port 40. Memory 37 may include a corresponding bank of dual-port elements 31 for each write port 40 (e.g., multiport memory 38 may include M+1 banks of elements 31). Each dual-port memory element 31 in a given bank may be coupled to a corresponding read port 42 through switching circuitry 36 (e.g., each bank may include N+1 dual-port memory elements 31).

During memory access operations, different circuits in control circuitry 12 (FIG. 1) may request memory access operations such as data read or write operations. Multiple requesting circuits may perform concurrent memory access requests with multi-port memory 37 (e.g., multiple requesting circuits may provide data to be written to circuitry 37 and/or may read data from circuitry 37). In order to accommodate multiple concurrent memory access requests, each requesting circuit may concurrently provide write data over a different write port 40 to a corresponding bank and/or may concurrently read data over a different read port 42. When performing a memory access request, the requesting circuits provide addressing control signals to multi-port memory circuitry 37. The addressing control signals specify a location on memory 37 at which data is to be written (e.g., when the addressing control signal is a write addressing signal) or a location on memory 37 from which data is to be read (e.g., when the addressing control signal is a read addressing signal). In order to emulate a multiport memory using dual-port memory elements, copies of the data to be written may be stored on each dual-port memory element in a given bank. The write data may be written on each dual-port memory element at the memory address identified by the corresponding addressing control signals.

Data may be written to the same memory address across different write ports or banks of memory elements. In this scenario, the more recently written data may effectively overwrite the previously-written data on memory circuitry 37, even though the previously-written data is still stored on a different bank of dual-port memory elements. When a memory read operation is requested, the most-recently written data at a given memory address is read out from memory 37 (e.g., as would be expected for a true multi-port memory element). Switching circuitry 36 may be controlled using read control signals RCTRL to route the most-recently written data for each memory address to a corresponding read port 42 (e.g., to route data from a most recently-written bank to the read port).

For example, when a memory access requesting circuit requests a memory read operation from circuitry 37, the requesting circuit may provide a corresponding read addressing signal to memory 37. Control circuitry 46 may process the read addressing signals along with previously-received write addressing signals to generate read control signals RCTRL that route most-recently written data to a corresponding read port. In this way, the memory access requesting circuits may interact with circuitry 37 as if circuitry 37 were a true multi-port memory element even though circuitry 37 is formed using dual-port memory elements. Emulated multiport memory circuitry 37 may thereby concurrently write and/or read data using multiple read and write ports. This may greatly increase the bandwidth and speed with which data can be written and read from memory on integrated circuit 10 relative to scenarios where only dual port memory elements 30 are used.

Figure 4:
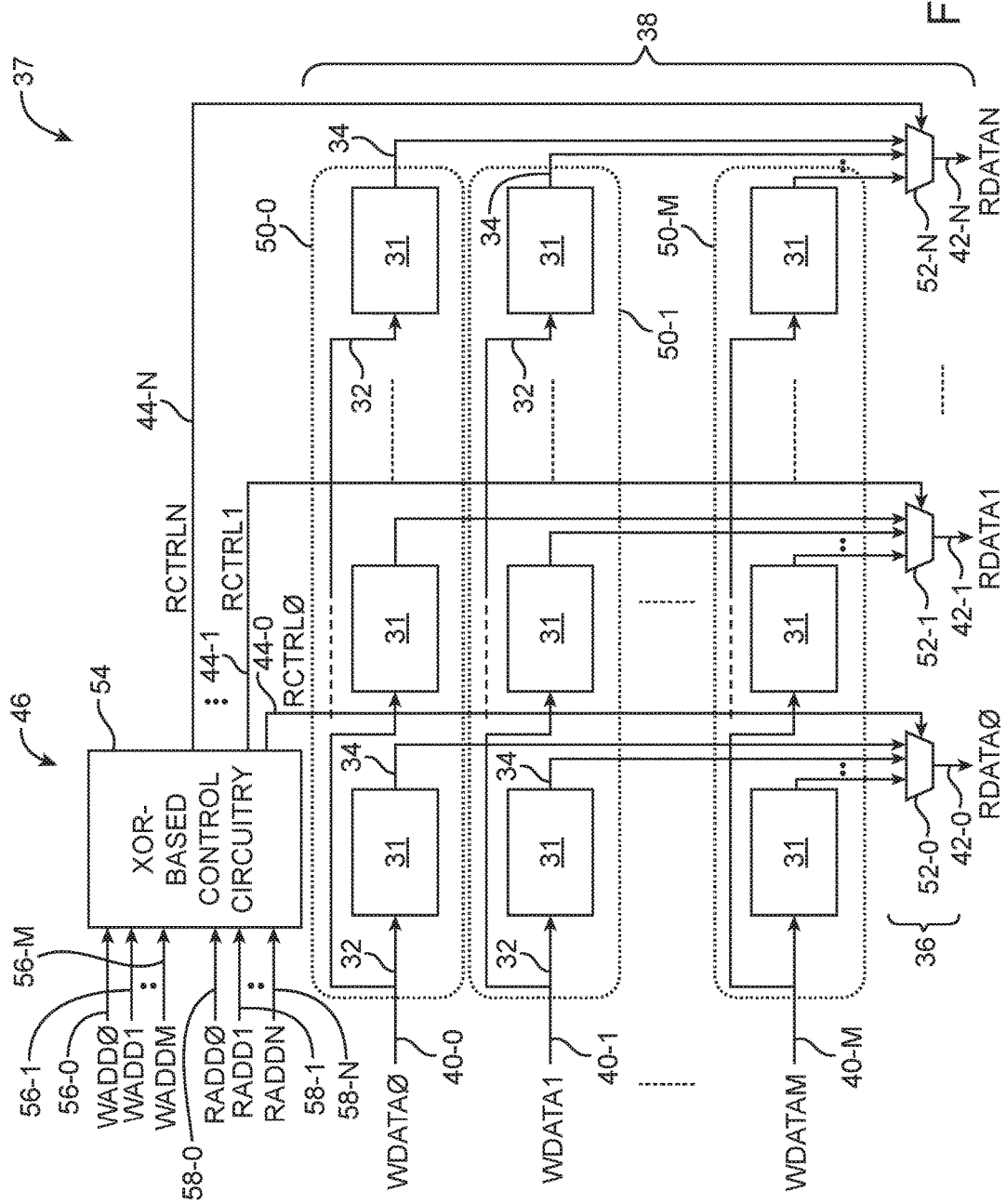
FIG. 4 is a circuit diagram showing how an illustrative multiport memory element may include a data portion of dual-port memory elements that is controlled using XOR-based control circuitry in accordance with an embodiment.

FIG. 4 is a circuit diagram showing how multiport memory circuitry 37 may include multiple banks of dual-port memory elements for supporting concurrent read and write operations. As shown in FIG. 4, multiport memory circuitry 37 includes banks 50 of dual-port memory elements 31 (e.g., memory elements such as dual-port block RAM memory elements 30 and 31 shown in FIGS. 2 and 3). In the example of FIG. 4, multiport memory 37 includes M+1 banks of dual-port elements 31 (e.g., a first bank 50-0, a second bank 50-1, etc.). Each bank may be coupled to a corresponding write port 40. Each bank 50 may include N+1 dual-port memory elements 31 (e.g., one memory element 31 for each read port 42). The read port 34 of each dual-port memory element 31 in a given bank 50 may be coupled to a different read port 42 of multiport memory 38 via a corresponding multiplexer 52 of switching circuitry 36. Each multiplexer 52 may have inputs that are each coupled to memory elements 31 in a corresponding column of each bank 50 (e.g., a first multiplexer 52-0 may have M+1 inputs that are coupled to the read ports 34 of the first dual-port memory element 31 in each bank 50 and may have an output coupled to read port 42-0 of circuitry 38, a second multiplexer 52-1 may have M+1 inputs that are coupled to the read ports 34 of the second dual-port memory element 31 in each bank 50 and an output coupled to read port 42-1, etc.).

The example in which switching circuitry 36 includes multiplexer circuitry is merely illustrative. In general, switching circuitry 36 may include cross-bar switching circuitry, switch matrix circuitry, a switching fabric, or any other desired switching circuitry. Each multiplexer circuit 52 may have a control input that receives a corresponding read control signal RCTRL from control circuitry 46 over a corresponding control path 44 (e.g., first multiplexer 42-0 may receive a first read control signal RCTRL from control circuitry 46 over path 44-0, second multiplexer 42-1 may receive a second read control signal RCTRL from control circuitry 46 over path 44-1, etc.). Read control signals RCTRL may control multiplexers 52 to route signals from a selected input to the corresponding read port 42.

Control circuitry 46 may include logic exclusive-OR (XOR) circuitry and may therefore sometimes be referred to herein as XOR-based control circuitry 54. XOR-based control circuitry 54 may contain one or more logic XOR gates and, if desired, one or more dual-ported memory elements that generate control signals RCTRL based on addressing control signals such as write addressing control signals WADD and read addressing control signals RADD. XOR-based control circuitry 54 may receive write addressing control signals WADD and read addressing control signals RADD from circuitry on integrated circuit 10 that is requesting a memory access operation (e.g., memory access requesting circuits on control circuitry 12). XOR-based control circuitry 54 may receive multiple write addressing control signals WADD in parallel over corresponding address control lines 56 from different memory requesting circuits that are requesting a memory write operation (e.g., circuitry 54 may receive a first write addressing signal WADD0 from a first requesting circuit over a first path 56-0, a second write addressing signal WADD1 from a second requesting circuit over a second path 56-1, etc.). Similarly, XOR-based control circuitry 54 may receive multiple read addressing control signals RADD in parallel over corresponding address control lines 58 from different memory requesting circuits that are requesting a memory read operation (e.g., circuitry 54 may receive a first read addressing signal RADD0 over a first path 58-0 from a first requesting circuit, a second read addressing signal RADD1 over a second path 58-1 from a second requesting circuit, etc.). In general, circuitry 54 may receive a write addressing signal for each write port of memory 37 and may receive a read addressing signal for each read port of memory 37 (e.g., circuitry 54 may receive M+1 write addressing signals WADD and N+1 read addressing signals RADD).

When circuitry such as control circuitry 12 on integrated circuit 10 requests a memory access operation (e.g., a memory write or read operation), the requesting circuitry may provide corresponding addressing signals WADD and/or RADD along with any corresponding data to be written to multiport memory circuitry 37. For example, the requesting circuitry may provide write data WDATA to multiport memory 37 over multiple write ports 40 as well as corresponding addressing signals WADD (e.g., identifying write addresses on memory 37 to be accessed).

Each requesting circuit may provide write data WDATA (e.g., respective write data values) over a different corresponding write port 40. For example, a first requesting circuit may provide write data WDATA0 to write port 40-0 to be stored at a first memory address on circuitry 37. The first requesting circuit may provide a corresponding write addressing signal WADD0 to XOR-based control circuitry 54 over path 56-0 that identifies the first memory address. Similarly, a second requesting circuit may provide write data WDATA1 to write port 40-1 to be stored at a second memory address on circuitry 37 (e.g., concurrently with the first requesting circuit providing write data WDATA0 or at a different time). The second requesting circuit may provide a corresponding write addressing signal WADD1 to control circuitry 54 over path 56-1 that identifies the second memory address. The second memory address may, in some scenarios, be different from the first memory address. However, in scenarios where the second requesting circuit intends to perform an overwrite operation (e.g., to overwrite data WDATA0 on memory circuitry 37), the second memory address may be the same as the first memory address. This process is described above in connection with ports 40-0 and 40-1 for the sake of illustration and, in general, may be performed for all desired combination of write ports.

Copies of the data WDATA to be written may be stored at each dual-port memory element 31 in the corresponding bank 50. For example, data WDATA0 provided by the first requesting circuit may be copied to each of the N+1 dual-port memory element 31 in bank 50-0. Each dual-port memory element 31 in bank 50-0 may store data WDATA0 at the first memory address identified by write addressing signal WADD0. Similarly, data WDATA1 provided by the second requesting circuit may be copied to each of the N+1 dual-port memory element 31 in bank 50-1. Each dual-port memory element 31 in bank 50-1 may store data WDATA1 at the second memory address identified by write addressing signal WADD1.

When circuitry 12 on integrated circuit 10 requests to perform a memory read operation, the requesting circuits may provide corresponding read address signals RADD to control circuitry 54 (e.g., identifying read addresses on memory 37 to be read). Each requesting circuit may, for example, be coupled to a different corresponding read port 42. XOR-based control circuitry 54 may process the read address signals (along with previously-received write address signals) to track the most recently written data across banks 50 for a given memory address. Circuitry 54 may generate read control signals RCTRL to control multiplexers 52 to route signals from the most recently-written banks 50 to the corresponding read port 42 of memory 37 for a given memory location.

For example, a third requesting circuit (e.g., a requesting circuit coupled to first read port 42-0) may request a memory read operation at the first read port from the first memory address. The third requesting circuit may provide read address signal RADD0 that identifies the first memory address from which the data is to be read to control circuitry 54 over path 58-0. Control circuitry 54 may process signal RADD0 as well as previously received write address signals WADD to generate a corresponding read control signal RCTRL0. Read control signal RCTRL0 may be provided to multiplexer 52-0 to route the data that was most recently written to the first memory address across banks 50. For example, control signal RCTRL0 may route the output of the first dual-port memory element 31 in first bank 50-0 to read port 42-0 so that corresponding data RDATA0 (e.g., data WDATA0) is conveyed from the first memory address on that dual-port memory element to read port 42-0 (and subsequently provided to the third requesting circuit).

In a scenario where the second memory address is the same as the first memory address (e.g., when the second requesting circuit writes data WDATA1 to circuitry 37 after the first requesting circuit writes data WDATA0, so as to perform an overwrite operation where data WDATA1 is intended to overwrite data WDATA0 on circuitry 37), control signal RCTRL0 may control multiplexer 42-0 to route the output of the first dual port memory element 31 in second bank 50-1 to read port 42-0 so that corresponding data RDATA0 (e.g., data WDATA1) is conveyed from the first memory address on that dual port memory element to read port 42-0. In this way, the correct (e.g., most recently-written) data for each given memory address is read from memory circuitry 37, thereby accurately emulating the operation of a true multi-port memory element using dual-port memory elements.

This process is described above in connection with write ports 40-0 and 40-1 and read port 42-0 for the sake of illustration and, in general, may be performed for any desired combination of write and read ports. Performing memory access operations in this way may allow for multiple concurrent read and write operations from circuitry 37. For example, circuitry 37 may have four total ports (e.g., two read and two write ports) for performing two concurrent and write operations, may have eight total ports for performing four concurrent read and write operations, etc. This may greatly increase the memory access bandwidth of circuitry 37 relative to an individual dual-port memory element 30.

In some scenarios, data portion 38 is controlled using a live value table (LVT) that tracks the most recently-written (e.g., "live") data for each memory address. Such an LVT is formed using a multi-port memory element that is implemented using logic on device 10 (e.g., using one or more adaptive logic modules, etc.) and that receives the write data itself for tracking the most recently written data. However, such LVT circuitry typically consumes excessive logical resources on device 10 (i.e., as is required to implement a multi-port memory element and as is required to store the write data itself). XOR-based control circuitry 54 may greatly reduce the number of logical resources required to control data portion 38 relative to scenarios where such a multi-port memory-based LVT is used. For example, XOR-based control circuitry 54 stores processed versions of address signals WADD, which are generally significantly smaller than write data WDATA, instead of storing write data WDATA itself.

Figure 5:
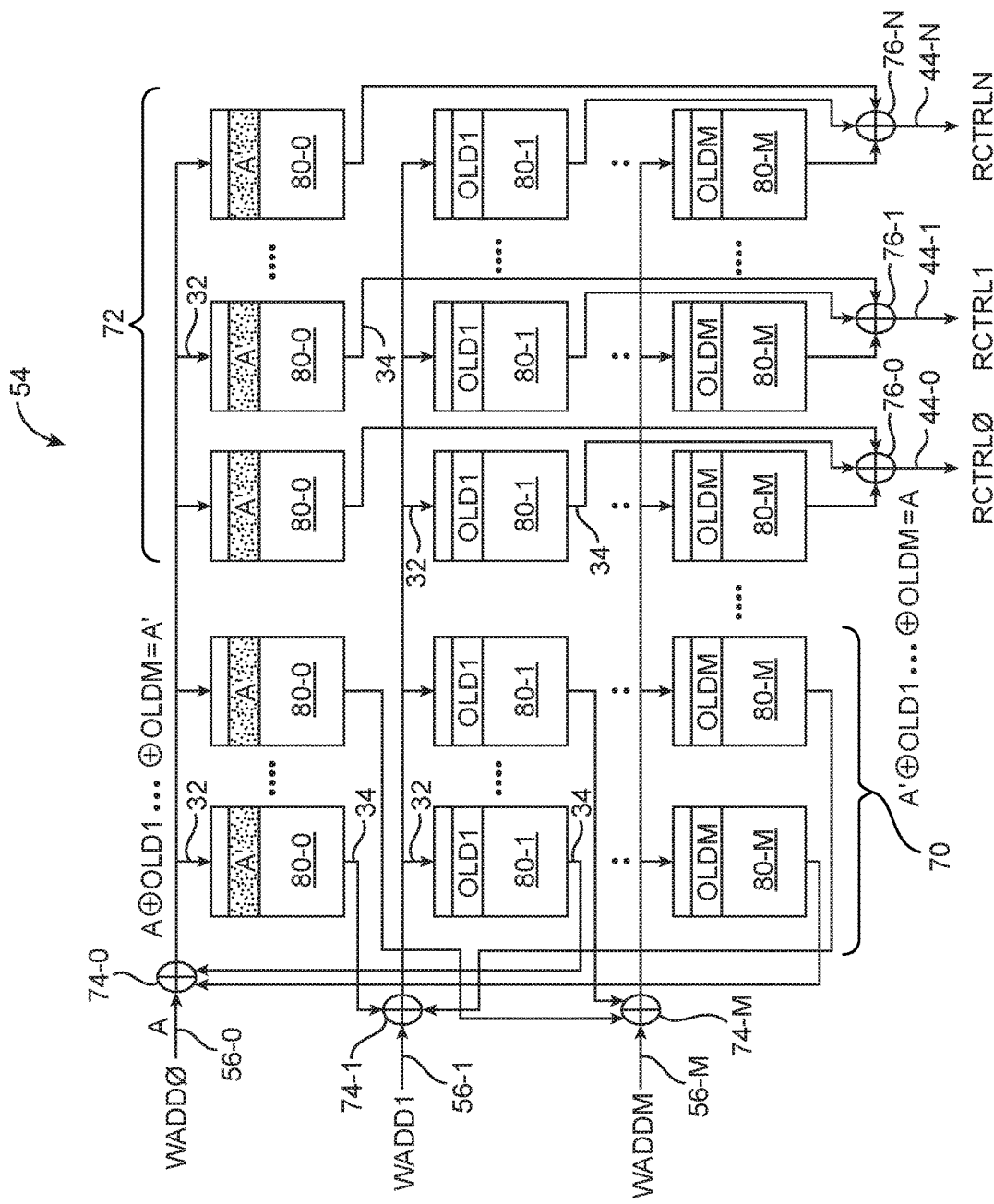
FIG. 5 is a circuit diagram showing illustrative XOR-based control circuitry that may be used for controlling a multiport memory element formed from multiple dual-port memory elements in accordance with an embodiment.

FIG. 5 is a circuit diagram showing how XOR-based control circuitry 54 may include multiple logic XOR gates and dual-port memory elements for controlling data portion 38. As shown in FIG. 5, XOR-based control circuitry 54 may include a multiple dual-port memory elements 80 (e.g., dual-port memory elements such as dual-port block RAM elements 30 of FIG. 2). Dual-port memory elements 80 may be arranged in rows and columns, for example. Each row of memory elements 80 may be coupled to the output of a single corresponding write (input) logic XOR gate 74. For example, each dual-port memory element 80 in the first row (group) of control circuitry 54 may have its write port coupled to the output of first write XOR circuit 74-0, each dual-port memory element 80 in the second row of circuitry 54 may have its write port coupled to the output of second write XOR circuit 74-1, etc.

In the example of FIG. 5, the input of each write XOR circuit 74 is coupled to a respective write address control line 56 (e.g., there may be M+1 write XOR circuits 74 and M+1 rows of dual-port memory elements 80) and a given memory element 80 from each row in circuitry 54 other than the row in which that XOR circuit is located. For example, logic XOR gate 74-0 may have inputs coupled to control line 56-0 and the first memory element 80 in each row except for the first row (e.g., from a corresponding element 80-1, 80-2, 80-M, etc. in each row), logic XOR gate 74-1 may have inputs coupled to control line 56-1 and a single element 80 in the each row except for the second row, etc.

Each write XOR gate 74 may perform logical XOR operations on their inputs to generate an output that is provided and written to the corresponding row of elements 80. To illustrate the operation of circuitry 54, consider the example shown in FIG. 5, in which a value A of write address signal WADD0 is provided to first XOR gate 74-0 over line 56-0. Value A of write address signal WADD0 may, for example, be a write address of corresponding data WDATA0 received by data portion 38 over write port 40-0 as shown in FIG. 4.

Previously-stored values OLD may be stored on each memory element 80 (e.g., the second row of elements 80-1 may each store a value OLD1, the last row of memory elements 80-M may each store a value OLDM, etc.). Values OLD may be generated based on previously-received write address signals WADD, for example. XOR gate 74-0 may perform a logical XOR operation on WADD0 value A with the previously-stored values OLD from each other row of memory elements 80. For example, XOR circuit 74-0 may output a value A' that is equal to (A) XOR (OLD1) XOR (OLD2) . . . XOR (OLDM). Output value A' may then be stored on each memory element 80-0 in the first row of circuitry 54. Similar operations may be performed to generate values that are stored on the other rows of circuitry 54 (e.g., as corresponding signals WADD are received).

Write addressing signals WADD may also be provided directly to addressing control inputs of memory elements 80 to control write addressing for memory elements 80 (e.g., write addressing control signal WADD0 may also be provided directly to an addressing input (not shown) of each of the memory elements 80-0 in the first row to control writing of XORed value A', write addressing control signal WADD1 may also be provided directly to an addressing input of each of the memory elements 80-1 in the second row to control writing of the output of XOR circuit 74-1, etc.). By writing processed (e.g., XORed) addressing signals to memory elements 80 in this manner, circuitry 54 may track which bank 50 in data portion 38 stores the most recently-written data for each memory address of memory circuitry 37.

Memory elements 80 in circuitry 54 may receive read address control signals RADD over corresponding control lines 58, which are not illustrated in FIG. 5 for the sake of clarity. Each column of memory elements 80 may receive a corresponding one of the read address control signals RADD. For example, each memory element 80 in the first column of circuitry portion 72 of 54 may receive read address control signal RADD0 over a control line 58-0 (as shown in FIG. 4), each memory element 80 in the second column of portion 72 of circuitry 54 may receive read address control signal RADD1 over control line 58-1, each memory element 80 in the last column of portion 72 of circuitry 54 may receive read address control signal RADDM over control line 58-N, etc. Read address control signals RADD may, for example, be used to read values from memory elements 80 that are provided to write XOR gates 74 (e.g., as a part of the write operation during which information such as data A' is written to the memory elements).

In addition, read address control signals RADD may be used to generate read control signals RCTRL. When a data read operation is requested from multiport memory element 37, the corresponding read address control signals RADD may control memory elements 80 within read portion 72 of circuitry 54 to generate corresponding read control signals RCTRL. The read ports of each element 80 within a given column of read portion 72 may be coupled to a corresponding read (output) logic XOR gate 76. For example, the read ports of memory elements 80 in the first column of portion 72 may be coupled to the input of read XOR gate 76-0, the read ports of memory elements 80 in the second column of portion 72 may be coupled to the input of read XOR gate 76-1, etc. In general, there may be N+1 columns of memory elements 80 in read portion 72 of circuitry 54 (e.g., the number of columns of read portion 72 may be equal to the number of columns of circuitry 38 or the number of read ports of circuitry 38).

Read XOR gates 76 may perform a logical XOR operation on data received from each memory element 80 in the corresponding column of portion 72 on circuitry 54 to generate a corresponding read control signal RCTRL (e.g., first read XOR gate 76-0 may generate first read control signal RCTRL0, second read XOR gate 76-1 may generate second read control signal RCTRL1, etc.). To illustrate the operation of read XOR gates 76, consider the example shown in FIG. 5, in which a value A' is stored in the first row of circuits 80, value OLD1 is stored in the second row of circuits 80, etc. In this scenario, read XOR gate 76-0 may perform a logical XOR operation on value A' with the values OLD through OLDM stored on each other row of memory elements 80 in its column. For example, XOR circuit 76-0 may perform the logical operation (A') XOR (OLD1) XOR (OLD2) . . . XOR (OLDM), which will logically retrieve value A (e.g., the originally stored value of write address control signal WADD0 for the first row). In this way, circuitry 54 may generate read control signals RCTRL that control multiplexers 52 in circuitry 38 to output the most recently written data for each memory address.

While the write ports of all memory elements 80 within circuitry 54 are coupled to write XOR circuits 74, the read ports of memory elements 80 within read portion 72 may not be coupled to write XOR gates 74, for example. If desired, circuitry 54 may include a number of columns of memory elements 80 that are not included in read portion 72 and that have read ports that are not coupled to read XOR gates 76. For example, circuitry 54 may include a write portion 70 of memory elements 80 that have read ports that are coupled to write XOR gates 74 without being coupled to read XOR gates 76. In general, there may be any desired number of columns in write portion 70. In one suitable arrangement, there may be M columns of memory elements 80 in write portion 70. By forming a write portion 70 that is separate from a read portion 72, circuitry 54 may perform write operations (e.g., writing signals to memory elements 80) while concurrently performing read operations (e.g., to generate read control signals RCTRL). This may enhance the overall speed of operation of circuitry 54 relative to scenarios where the read ports of all elements 80 are coupled to write XOR gates 74, for example.

Figure 6:
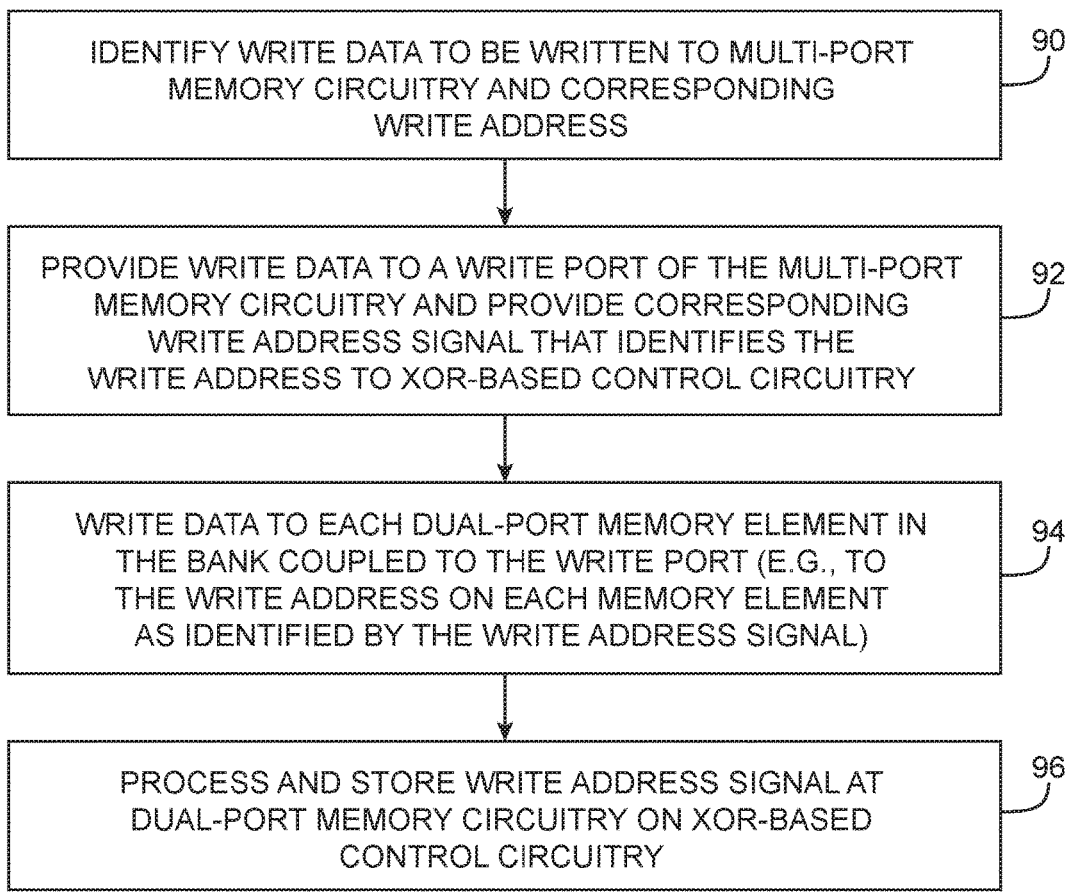
FIG. 6 is a flow chart of illustrative steps that may be performed by an integrated circuit for writing data to a multiport memory element of the type shown in FIGS. 3-5 in accordance with an embodiment.

FIG. 6 is a flow chart of illustrative steps that may be processed by device 10 to write data to multiport memory circuitry 37 having dual-port memory elements.

At step 90, control circuitry 12 on device 10 (FIG. 1) may identify write data WDATA for writing to multiport memory circuitry 37. Control circuitry 12 may identify a corresponding write address on multiport memory circuitry 37 for writing the identified write data and may generate a corresponding write address control signal WADD.

At step 92, control circuitry 12 may provide the identified write data WDATA and a corresponding write address control signal WADD to multiport memory circuitry 37. For example circuitry 12 may provide write data WDATA to data portion 38 of memory circuitry 37 over a corresponding write port 40 of multiport memory circuitry 37. Circuitry 12 may provide write address control signal WADD to XOR-based control circuitry 54 over a corresponding control path 56.

At step 94, the write data WDATA may be written to each dual-port memory element 31 in the bank 50 that is coupled to the corresponding write port 40. The write data WDATA may, for example, be stored at the write address identified by control signal WADD on each memory element 31 in the bank.

At step 96, XOR-based control circuitry 54 may process the received write address control signal WADD. For example, a corresponding write XOR circuit 74 may perform a logic XOR operation on received signal WADD with corresponding stored values from memory elements 80 that are coupled to other control lines 56. The output of that XOR circuit 74 may be written to all dual-port memory elements 80 in the corresponding row. These steps may, for example, be repeated any time data WDATA is to be written to multiport memory element 37. If desired, the steps of FIG. 6 may performed for multiple values of write data WDATA provided to different ports and/or write addresses of multiport memory circuitry 37. Steps 94 and 96 may, if desired, be performed concurrently, or step 96 may be performed prior to performing step 94.

Figure 7:
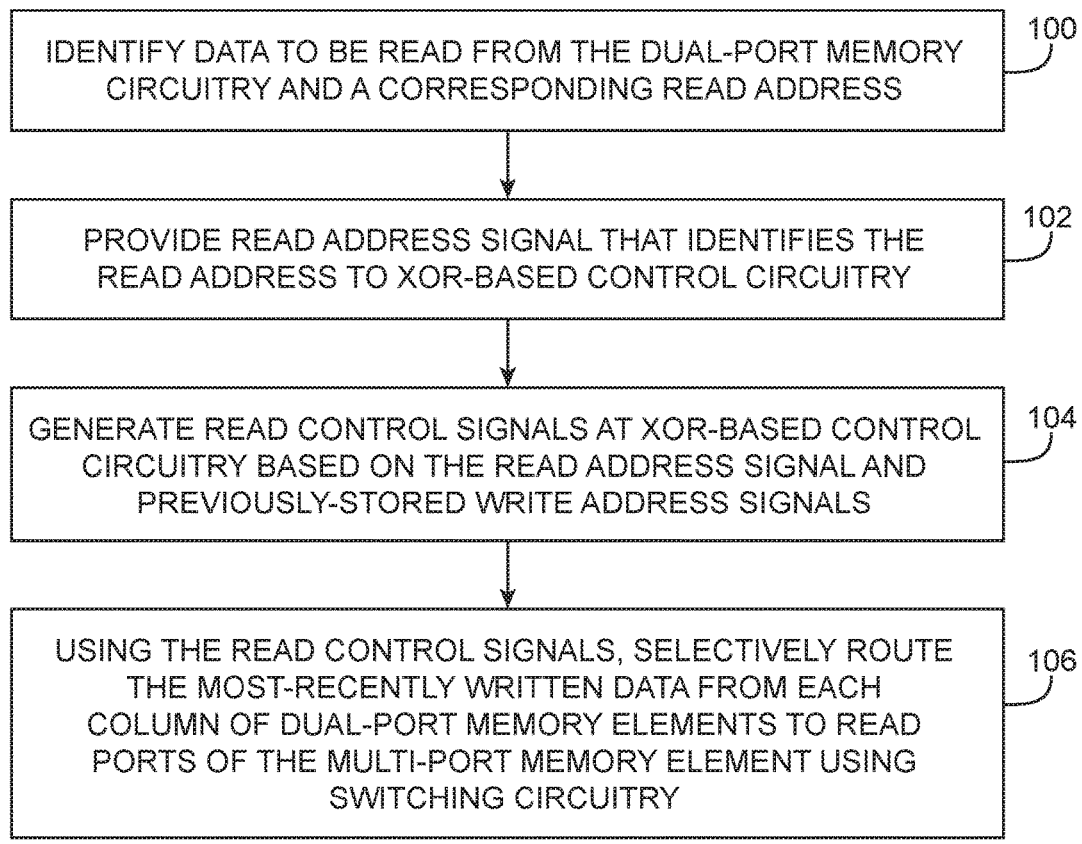
FIG. 7 is a flow chart of illustrative steps that may be performed by an integrated circuit for reading data from a multiport memory element of the type shown in FIGS. 3-5 in accordance with an embodiment.

FIG. 7 is a flow chart of illustrative steps that may be processed by device 10 to read data from multiport memory circuitry 37 having dual-port memory elements. The steps of FIG. 7 may, for example, be performed after data has been written to multiport memory circuitry 37 (e.g., after processing step 96 of FIG. 6).

At step 100, control circuitry 12 on device 10 (FIG. 1) may identify data to be read from multiport memory circuitry 37. Control circuitry 12 may identify a corresponding read address on multiport memory circuitry 37 for reading the identified data and may generate a corresponding read address control signal RADD.

At step 102, control circuitry 12 may provide read address control signal RADD to multiport memory circuitry 37. For example circuitry 12 read address control signal RADD to XOR-based control circuitry 54 over a corresponding control path 58.

At step 104, XOR-based control circuitry 54 may generate read control signals RCTRL based on read address control signal RADD and the previously-stored processed write address control signals WADD stored on memory elements 80. For example, XOR-based control circuitry may perform logical XOR operations on the stored and processed write address control signals using read XOR gates 76 to generate read control signals RCTRL that are provided over control lines 44.

At step 106, read control signals RCTRL may be provided to switching circuitry 52 over paths 44. Control signals RCTRL may control switches 42 to route the most-recently written data from a corresponding column of dual-port memory elements 31 onto a corresponding read port 42 as read data RDATA. This read data RDATA may be the data requested by control circuitry 12 and may subsequently be provided to control circuitry 12. These steps may, for example, be repeated any time data RDATA is to be read from multiport memory element 37. If desired, the steps of FIG. 7 may performed concurrently for multiple values of read data RDATA to be read from different addresses and read ports of multiport memory circuitry 37. In this way, data may be concurrently read and written to and from multiple read and write addresses on emulated multi-port memory circuitry 37, thereby increasing the overall memory access speed and bandwidth of the system relative to scenarios in which only dual-port memory elements are used for storing data.

By controlling data portion 38 using XOR-based control circuitry 54, circuitry 37 may require fewer logical resources relative to scenarios where a multi-port memory-based LVT that receives the write data itself is used to control data portion 38. For example, circuitry 37 may be implemented using fewer than 1% as many adaptive logic modules (ALMs) on device 10 as in scenarios where a multi-port memory-based LVT controls data portion 38. Similarly, the maximum frequency or multiport memory 37 may be as much as twice that of scenarios where an LVT is used to control data portion 38. In other scenarios, logic XOR circuitry is used to emulate a multiport memory without controlling a corresponding data portion 38. In these scenarios, the logic XOR circuitry receives and stores the write data itself onto dual-port memory elements while also outputting read data. Multiport memory 37 having data portion 38 and XOR-based control circuitry 54 may consume fewer than half as many logical resources (e.g., ALMs), as much as 30% fewer memory resources (e.g., because control circuitry 54 need only store addressing signals which are much smaller than the write data signals), and may operate with as much as a 25% greater maximum frequency relative to such scenarios.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. Memory element circuitry having a plurality of write ports and a plurality of read ports, the memory element circuitry comprising:
   a plurality of banks of dual-port memory elements, wherein each bank in the plurality of banks is coupled to a respective one of the write ports;
   a switching circuit coupled between the plurality of banks of dual-port memory elements and a first read port of the plurality of read ports; and
   a logic exclusive-OR (XOR) gate coupled to a control input of the switching circuit, wherein the logic XOR gate receives signals based on previously-stored write address signals and outputs a read control signal that controls the switching circuit to selectively route read data from the plurality of banks of dual-port memory elements to the first read port.

2. The memory element circuitry defined in claim 1, wherein the switching circuit has a plurality of inputs and each input of the plurality of inputs is coupled to a different respective bank in the plurality of banks of dual-port memory elements.

3. The memory element circuitry defined in claim 2, wherein the switching circuit has a first input coupled to a read port of a first dual-port memory element in a first bank of the plurality of banks, and wherein the switching circuit has a second input coupled to a read port of a second dual-port memory element in a second bank of the plurality of banks.

4. The memory element circuitry defined in claim 1, wherein each write port of the plurality of write ports conveys write data to each dual-port memory element in a different respective bank of the plurality of banks of dual-port memory elements.

5. The memory element circuitry defined in claim 4, further comprising:
   control circuitry that receives a write addressing control signal associated with the write data, wherein the logic XOR gate generates the read control signal based at least partially on the write addressing control signal received by the control circuitry.

6. The memory element circuitry defined in claim 5, wherein the control circuitry comprises:
   an additional logic XOR gate that has an input that receives the write addressing control signal; and
   a group of dual-port memory elements coupled between an input of the logic XOR gate and an output of the additional logic XOR gate.

7. The memory element circuitry defined in claim 6, wherein the group of dual-port memory elements comprises block Random Access Memory (RAM) circuits each having a single read port and a single write port.

8. The memory element circuitry defined in claim 1, further comprising:
   an additional switching circuit coupled between the plurality of banks of dual-port memory elements and a second read port of the plurality of read ports; and
   an additional logic XOR gate coupled to a control input of the additional switching circuit, wherein the additional logic XOR gate outputs an additional read control signal that controls the additional switching circuit to selectively route additional read data from the plurality of banks of dual-port memory elements to the second read port.

9. The memory element circuitry defined in claim 8, wherein the switching circuit comprises a first multiplexer having a first input coupled to a read port of a first dual-port memory element in a first bank of the plurality of banks and having a second input coupled to a read port of a second dual-port memory element in a second bank of the plurality of banks, and wherein the additional switching circuit comprises a second multiplexer having a third input coupled to a read port of a third dual-port memory element in the first bank and having a fourth input coupled to a read port of a fourth dual-port memory element in the second bank.

10. The memory element circuitry defined in claim 1, wherein the dual-port memory elements comprise block Random Access Memory (RAM) circuits each having a single write port and a single read port.

11. Memory circuitry that receives write data over a plurality of write ports and that has a plurality of read ports, comprising:
    a first set of logic exclusive-OR (XOR) gates that receives addressing control signals associated with the write data;
    a second set of logic XOR gates that is different from the first set of logic XOR gates and that generates read control signals based on previously-stored addressing control signals associated with the write data;
    a group of dual-port memory elements coupled between the first and second sets of logic XOR gates;
    data storage circuitry that stores the write data, wherein the data storage circuitry comprises multiple memory banks; and
    switching circuitry coupled between the multiple memory banks, wherein the switching circuitry selectively routes a most recently-written write data value from a particular memory bank of the multiple memory banks in the data storage circuitry to a given read port of the plurality of read ports based on the read control signals generated by the second set of logic XOR gates.

12. The memory circuitry defined in claim 11, wherein the first set of logic XOR gates generates modified addressing control signals based on the received addressing control signals and wherein the group of dual-port memory elements stores the modified addressing control signals.

13. The memory circuitry defined in claim 12, wherein the modified addressing control signals stored on the group of dual-port memory elements are read and provided to inputs of the second set of logic XOR gates and the second set of logic XOR gates generates the read control signals based on the modified addressing signals read from the group of dual-port memory elements.

14. The memory circuitry defined in claim 11, wherein the group of dual-port memory elements comprises a first set of dual-port memory elements having write ports coupled to outputs of the first set of logic XOR gates and having read ports coupled to inputs of the second set of logic XOR gates.

15. The memory circuitry defined in claim 14, wherein the group of dual-port memory elements further comprises a second set of dual-port memory elements having write ports coupled to the outputs of the first set of logic XOR gates and having read ports coupled to inputs of the first set of logic XOR gates.

16. The memory circuitry defined in claim 11, wherein the group of dual-port memory elements comprises:
   a first row of dual-port memory elements having write ports that are coupled to an output of a first logic XOR gate in the first set of logic XOR gates; and
   a second row of dual-port memory elements having write ports that are coupled to an output of a second logic XOR gate in the first set of logic XOR gates, wherein the first logic XOR gate has a first input that receives a first addressing control signal and a second input that is coupled to an output of a dual-port memory element in the second row, and wherein the second logic XOR gate has a third input that receives a second addressing control signal and a fourth input that is coupled to an output of a dual-port memory element in the first row.

17. The memory circuitry defined in claim 11, wherein the data storage circuitry comprises a plurality of banks of dual-port memory elements, each bank receives a respective write data value, each dual-port memory element in each bank stores a copy of the respective write data value received by that bank, and the switching circuitry selectively routes the most recently-written write data value from a given one of the banks of dual-port memory elements to the given read port based on the read control signals.

18. A method of operating memory circuitry on an integrated circuit, the method comprising:
   with a first set of dual-port memory elements, storing write data received over a plurality of write ports of the memory circuitry;
   with control circuitry, receiving write addressing signals associated with the write data, processing the write addressing signals, and storing the previously processed write addressing signals on a second set of dual-port memory elements that is different from the first set of dual-port memory elements; and
   with exclusive-OR (XOR) logic circuitry, controlling switching circuitry interposed between the first set of dual-port memory elements and a plurality of read ports of the memory circuitry to selectively route the write data stored on selected dual-port memory elements of the first set of dual-port memory elements to a plurality of read ports of the memory circuitry based on the previously processed write addressing signals stored on the second set of dual-port memory elements.

19. The method defined in claim 18, wherein the switching circuitry comprises a respective switch coupled to each of the read ports in the plurality of read ports, and wherein the XOR logic circuitry comprises respective XOR logic gates that each provides a respective read control signal to a corresponding one of the respective switches.

20. The method defined in claim 18, further comprising:
   at the first set of dual-port memory elements, concurrently receiving the write data over each of the plurality of write ports, wherein controlling the switching circuitry comprises controlling the switching circuitry to concurrently route the write data stored on the first set of dual-port memory elements to each of the plurality of read ports.

* * * * *